United States Patent
Matsuyama et al.

(10) Patent No.: US 11,887,882 B2
(45) Date of Patent: Jan. 30, 2024

(54) HOLDING JIG

(71) Applicant: C. Uyemura & Co., Ltd., Osaka (JP)

(72) Inventors: Daisuke Matsuyama, Hirakata (JP); Daisuke Hashimoto, Hirakata (JP); Kazuyoshi Nishimoto, Hirakata (JP); Tomoji Okuda, Hirakata (JP)

(73) Assignee: C. UYEMURA & CO., LTD., Osaka (JP)

( * ) Notice: Subject to any disclaimer, the term of this patent is extended or adjusted under 35 U.S.C. 154(b) by 690 days.

(21) Appl. No.: 16/683,699

(22) Filed: Nov. 14, 2019

(65) Prior Publication Data

US 2020/0168499 A1     May 28, 2020

(30) Foreign Application Priority Data

Nov. 26, 2018   (JP) ................................ 2018-220245

(51) Int. Cl.
*H01L 21/68*     (2006.01)
*H01L 21/687*    (2006.01)
(Continued)

(52) U.S. Cl.
CPC .......... *H01L 21/6875* (2013.01); *B05C 13/02* (2013.01); *H01L 21/67057* (2013.01)

(58) Field of Classification Search
CPC ........... H01L 21/6875; H01L 21/67057; H01L 21/67086; H01L 21/67751;
(Continued)

(56) References Cited

U.S. PATENT DOCUMENTS

| 4,376,382 A | 3/1983 | Raymond et al. |
| 2002/0029963 A1* | 3/2002 | Yoshioka ............. C25D 17/001 204/224 R |

(Continued)

FOREIGN PATENT DOCUMENTS

| CN | 103874790 A | * | 6/2014 | ........... C25D 17/001 |
| CN | 104752242 A | * | 7/2015 | ........... H01L 21/568 |

(Continued)

OTHER PUBLICATIONS

Japanese Office Action dated May 10, 2022 in corresponding Japanese Application No. 2018-220245, with Machine English Translation.

(Continued)

*Primary Examiner* — Mohammed Shamsuzzaman
(74) *Attorney, Agent, or Firm* — Wenderoth, Lind & Ponack, L.L.P.

(57) ABSTRACT

An object of the present invention is to provide a holding jig that is used for applying a liquid bath treatment to a planar workpiece, has good cleaning capabilities, and avoids intimate contact of the planar workpiece with a rear member of the holding jig so that the planar workpiece can be easily detached from the holding jig after cleaning. A holding jig is used for applying a liquid bath treatment to a planar workpiece. The holding jig comprises a rear member, and a front member that faces the rear member and has an opening portion. The planar workpiece is disposed between the rear member and the front member, and the rear member has a plurality of projections formed on the surface of the rear member facing the front member.

8 Claims, 5 Drawing Sheets

(51) Int. Cl.
*H01L 21/67* (2006.01)
*B05C 13/02* (2006.01)

(58) Field of Classification Search
CPC ......... H01L 21/68721; H01L 21/68764; B05C 13/02; B05C 3/09; C23C 18/163; C25D 17/00; C25D 17/06; C25D 17/08
See application file for complete search history.

(56) References Cited

U.S. PATENT DOCUMENTS

| | | | |
|---|---|---|---|
| 2013/0255360 A1 | 10/2013 | Minami et al. | |
| 2014/0251798 A1* | 9/2014 | Yoshioka | C25D 17/06 204/297.01 |
| 2016/0222540 A1 | 8/2016 | Minami et al. | |
| 2017/0159203 A1 | 6/2017 | Minami et al. | |
| 2019/0084777 A1 | 3/2019 | Mukaiyama et al. | |
| 2019/0249325 A1 | 8/2019 | Minami et al. | |

FOREIGN PATENT DOCUMENTS

| | | | | | |
|---|---|---|---|---|---|
| CN | 103225099 B | * | 1/2016 | ........... | C25D 17/001 |
| CN | 105408991 B | * | 7/2019 | ............... | G03F 7/20 |
| EP | 1113093 A1 | * | 7/2001 | ........... | C25D 17/001 |
| JP | 57-100269 | | 12/1982 | | |
| JP | 4-29662 | | 3/1992 | | |
| JP | 11-172492 | | 6/1999 | | |
| JP | 4037504 B2 | * | 1/2008 | ........... | C25D 17/001 |
| JP | 3154267 U | * | 10/2009 | ........... | C25D 17/001 |
| JP | 2013-142169 | | 7/2013 | | |
| JP | 2017-110303 | | 6/2017 | | |
| JP | 2017110303 A | * | 6/2017 | ........... | C25D 17/001 |
| JP | 2019081914 A | * | 5/2019 | ........... | C23C 18/163 |
| JP | 6739295 B2 | * | 8/2020 | | |
| JP | 6739307 B2 | * | 8/2020 | ........... | C25D 17/001 |
| TW | 202108827 A | * | 3/2021 | ........... | C25D 17/004 |
| WO | WO-2013057802 A1 | * | 4/2013 | ........... | C25D 17/001 |
| WO | 2017/163849 | | 9/2017 | | |
| WO | WO-2019021607 A1 | * | 1/2019 | ......... | B65G 49/0436 |

OTHER PUBLICATIONS

Taiwanese Office Action dated Mar. 17, 2023 in corresponding Taiwanese Patent Application No. 108142460, with English translation.

Office Action dated Oct. 9, 2023 in corresponding Chinese Application No. 201911141722.8, with English machine translation.

* cited by examiner

HOLDING JIG

CROSS-REFERENCE TO RELATED APPLICATIONS

This application is related to and claims priority under 35 U.S.C. 119 to Japanese patent application No. 2018-220245, filed on Nov. 26, 2018.

TECHNICAL FIELD

The present invention relates to a holding jig used for applying a liquid bath treatment to a planar workpiece that is disposed between a rear member and a front member that faces the rear member and has an opening portion.

BACKGROUND ART

In applying a liquid bath treatment such as a surface treatment to a planar workpiece, for example, a holding jig for fixing the planar workpiece is used. The planar workpiece fixed to the holding jig is immersed in a liquid bath, so that the liquid bath treatment is applied to the planar workpiece. As the holding jig for fixing the planar workpiece, for example, a holding jig is used which has a rear member and a front member that faces the rear member and has an opening portion. The planar workpiece is disposed between the rear member and the front member.

Such a holding jig for fixing a planar workpiece is disclosed in Patent Document 1. In order that a semiconductor wafer is easily mounted, a plating jig for semiconductor wafer disclosed in Patent Document 1 has a first holding member and a second holding member provided with a sealing gasket. The semiconductor wafer is sandwiched and held between the first holding member and the sealing gasket of the second holding member. The plating jig is so structured that the surface of the semiconductor wafer, held in the inner surface of the sealing gasket, is exposed.

RELATED ART DOCUMENTS

Patent Documents

Patent Document 1: Japanese unexamined patent application publication No. 11-172492

DISCLOSURE OF THE INVENTION

Problems to be Solved by the Invention

In the meantime, after the planar workpiece is fixed to the holding jig and a liquid bath treatment is applied to the planar workpiece, for example, the holding jig to which the planar workpiece is fixed is immersed in a cleaning solution and cleaned, and then the planar workpiece is detached from the holding jig. However, even after cleaning, a treatment solution adhered to the holding jig is not removed from the holding jig in some cases. In other cases, since the planar workpiece makes intimate contact with a rear member of the holding jig, it is difficult to detach the planar workpiece from the holding jig.

The present invention has been achieved in light of the foregoing situations, and therefore, an object of the present invention is to provide a holding jig that is used for applying a liquid bath treatment to a planar workpiece, has good cleaning capabilities, and avoids intimate contact of the planar workpiece with a rear member of the holding jig so that the planar workpiece can be easily detached from the holding jig after cleaning.

Solutions to the Problems

The present invention includes the following inventions.
[1] A holding jig used for applying a liquid bath treatment to a planar workpiece comprising, a rear member, and a front member that faces the rear member and has an opening portion, wherein the planar workpiece is disposed between the rear member and the front member, wherein the rear member has a plurality of projections formed on the surface of the rear member facing the front member.
[2] The holding jig according to [1], wherein a shape of top surfaces of the projections in plan view has a linear portion that is not parallel to a direction orthogonal to a direction of gravity.
[3] The holding jig according to [2], wherein the shape of the top surfaces of the projections in plan view is a polygon.
[4] The holding jig according to [3], wherein the polygon is a rhombus.
[5] The holding jig according to any one of [1] to [4], wherein the projections are arranged to form a lattice in the surface of the rear member facing the front member.
[6] The holding jig according to [5], wherein the lattice is a rhombic lattice, a triangular lattice, or a parallelogrammic lattice.
[7] The holding jig according to any one of [1] to [6], wherein the projections have an average height of 1 to 3 mm in a cross section of a thickness direction of the rear member.
[8] The holding jig according to any one of [1] to [7], wherein the rear member has a through-hole passing through the rear member in the thickness direction.
[9] The holding jig according to [8], wherein the through-hole is formed in an upper part that is above highest projections in the direction of gravity, and/or formed in a lower part that is below lowest projections in the direction of gravity.
[10] The holding jig according to any one of [1] to [9], wherein a total area of the top surfaces of the projections is 80 area % or less of an area of the opening portion.

Effects of the Invention

According to the present invention, since the rear member of the holding jig has a plurality of projections on the surface that contacts the planar workpiece attached to the holding jig, an area where the rear member of the holding jig contacts the planar workpiece is small. This can avoid intimate contact of the planar workpiece with the rear member of the holding jig. A treatment solution is therefore less likely to remain between the rear member of the holding jig and the planar workpiece, resulting in improved cleaning capabilities. Further, the intimate contact between the planar workpiece and the rear member can be avoided, so that the planar workpiece can be easily detached from the holding jig after cleaning.

MODE FOR CARRYING OUT THE INVENTION

A holding jig according to the present invention is used for applying a liquid bath treatment to a planar workpiece. The holding jig comprises a rear member, and a front member that faces the rear member and has an opening portion. And the planar workpiece is disposed between the rear member and the front member, and the rear member has a plurality of projections formed on the surface of the rear member facing the front member. Hereinafter, the holding jig according to the present invention is specifically described with reference to drawings. The present invention is not limited to the illustrated examples, and modifications may be made to the illustrated examples within the foregoing and following content. The modifications are also included in the technical scope of the present invention.

Figure 1:
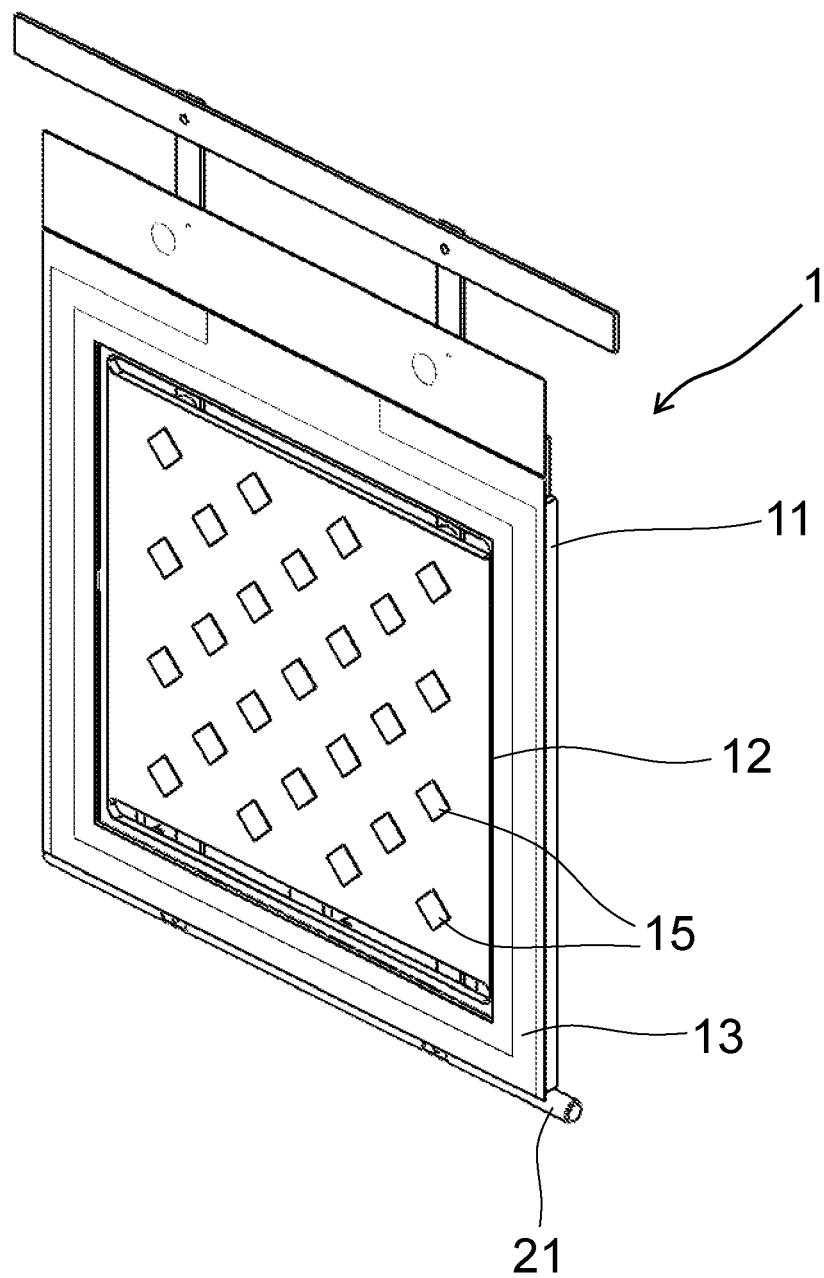
FIG. 1 is perspective view which shows an example of a holding jig 1 according to an embodiment of the present invention, and a state in which a rear member and a front member are closed.
Figure 2:
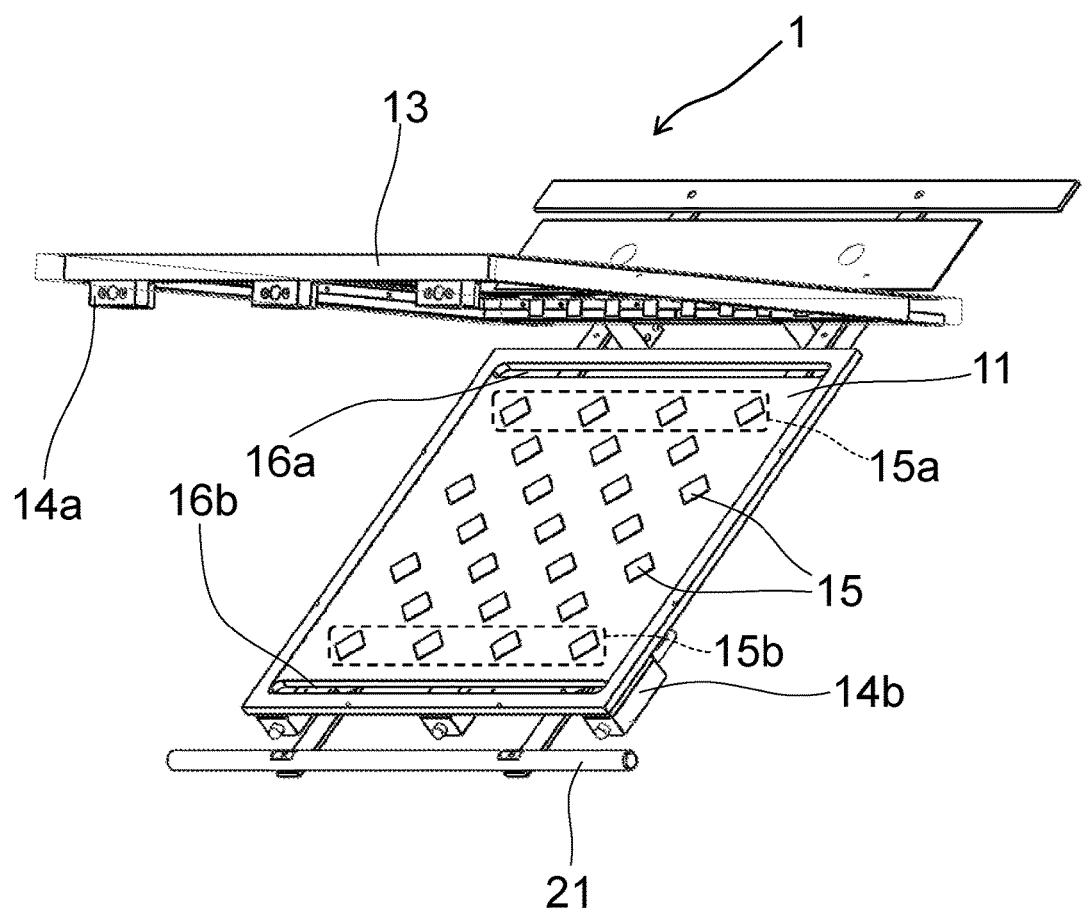
FIG. 2 is perspective view which shows an example of a holding jig 1 according to an embodiment of the present invention, and a state in which the rear member and the front member are opened.
Figure 5:
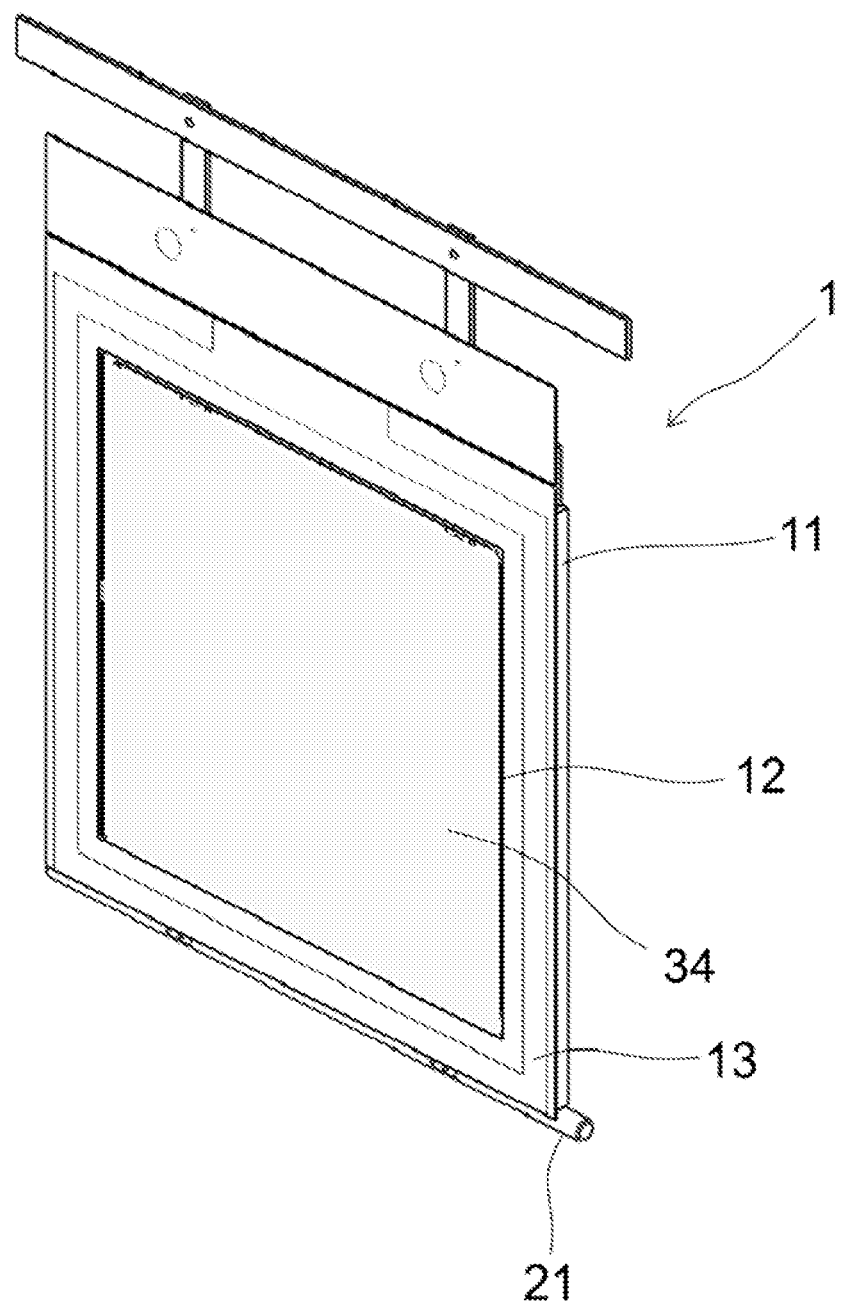
FIG. 5 is a perspective view that is similar to FIG. 1 but shows the holding jig in a state in which a planar workpiece is disposed between the rear member and the front member in a closed position.

FIGS. 1 and 2 are perspective views each of which shows an example of a holding jig 1 according to an embodiment of the present invention. FIG. 1 shows a state in which a rear member 11 and a front member 13 are closed. The front member 13 faces the rear member 11 and has an opening portion 12. FIG. 2 shows a state in which the rear member 11 and the front member 13 are opened. It is noted that a planar workpiece is not shown in FIGS. 1 and 2. FIG. 5 shows a planar workpiece 34 between the rear member 11 and the front member 13. The planar workpiece 34 is partially exposed through the opening portion 12.

Figure 3:
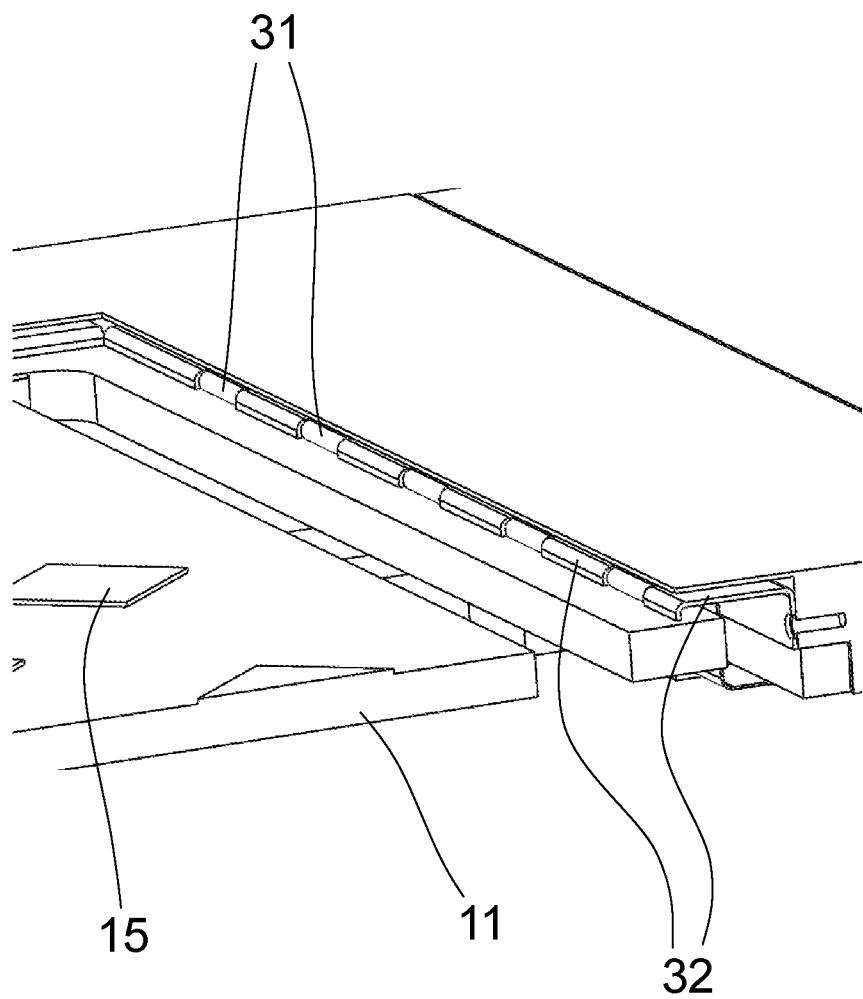
FIG. 3 is an enlarged view showing a connecting part between the rear member and the front member in an example of a holding jig 1 according to an embodiment of the present invention.

FIG. 3 is an enlarged view showing a connecting part between the rear member 11 and the front member 13 shown in FIGS. 1 and 2. The same reference signs have been given to the same parts as those in FIGS. 1 and 2, and the description thereof is not repeated.

In FIG. 3, the front member 13 is detached from the rear member 11, and shielding members 32 and contacts 31 provided in the connecting part between the rear member 11 and the front member 13 are shown. The contacts 31 show connecting positions between an electrode and the planar workpiece. The shielding members 32 serve to shield so that electricity and a treatment solution do not flow in an edge part of the planar workpiece.

The description goes on to steps for using the holding jig 1 to apply a liquid bath treatment to the planar workpiece. First, as shown in FIG. 2, the rear member 11 and the front member 13 are opened, and the planar workpiece (not shown) is disposed on the surface of the rear member 11 facing the front member 13. After that, as shown in FIG. 1, the rear member 11 and the front member 13 are closed, and open/close locks 14a and 14b are used to avoid opening of the rear member 11 and the front member 13. Next, the holding jig 1 in which the planar workpiece is held is immersed in, for example, a treatment solution of a treatment tank for liquid bath treatment, and the liquid bath treatment is applied to the planar workpiece. After the liquid bath treatment, the holding jig 1 in which the planar workpiece is held is cleaned. After that, the open/close locks 14a and 14b are unlocked to open the rear member 11 and the front member 13, and then, the planar workpiece is detached from the holding jig 1.

The holding jig 1 has a plurality of projections 15 on the surface of the rear member 11 facing the front member 13. The plurality of projections 15 do not allow intimate contact between the planar workpiece and the surface of the rear member 11 facing the front member 13, which leaves a gap between the planar workpiece and the surface. This makes it easy for the treatment solution to be discharged from the holding jig 1, resulting in improved cleaning capabilities. An area where the surface and the planar workpiece contact each other is small because of the plurality of projections 15. This allows the planar workpiece to be easily detached from the rear member 11 of the holding jig 1. Further, the holding jig 1 of the present invention has good drainage, which reduces an amount of treatment solution dragged out of the treatment tank.

The projections 15 protrude in the thickness direction of the rear member 11. It is preferable that the top surfaces of the projections 15 be on the same plane.

The top surfaces of the projections 15 mean surfaces contacting the planar workpiece.

The shape of the top surfaces of the projections in plan view is not limited to a specific shape, and may be, for example, a circle, an oval, a semicircle, a broom-like shape (shape of oar for rowing a boat), or a polygon. The shape of the top surfaces of the projections in plan view means a shape thereof, as viewed from a direction vertical to the surface of the rear member 11 facing the planar workpiece.

It is preferable that, when the holding jig 1 is stood in the direction of gravity, the shape of the top surfaces of the projections in plan view has linear portions not parallel to a direction orthogonal to the direction of gravity. The linear portions not parallel to the direction orthogonal to the direction of gravity allow the treatment solution to flow downward along the non-parallel linear portions when the holding jig 1 is stood in the direction of gravity. This enables the treatment solution to be easily discharged from the holding jig 1, leading to improved cleaning capabilities. Further, drainage of the treatment solution is expedited, which reduces a drag-out volume of the treatment solution.

It is preferable that the shape of the top surfaces of the projections in plan view be, for example, a polygon. As the polygon, for example, a rectangle or a rhombus is preferable, and a rhombus is more preferable. Examples of the rhombus include a square, and a diamond.

FIGS. 4(a) to 4(d) show examples of the shape of the top surfaces of the projections in plan view. In FIGS. 4(a) to 4(d), hatched parts show the top surfaces of the projections.

Figure 4:
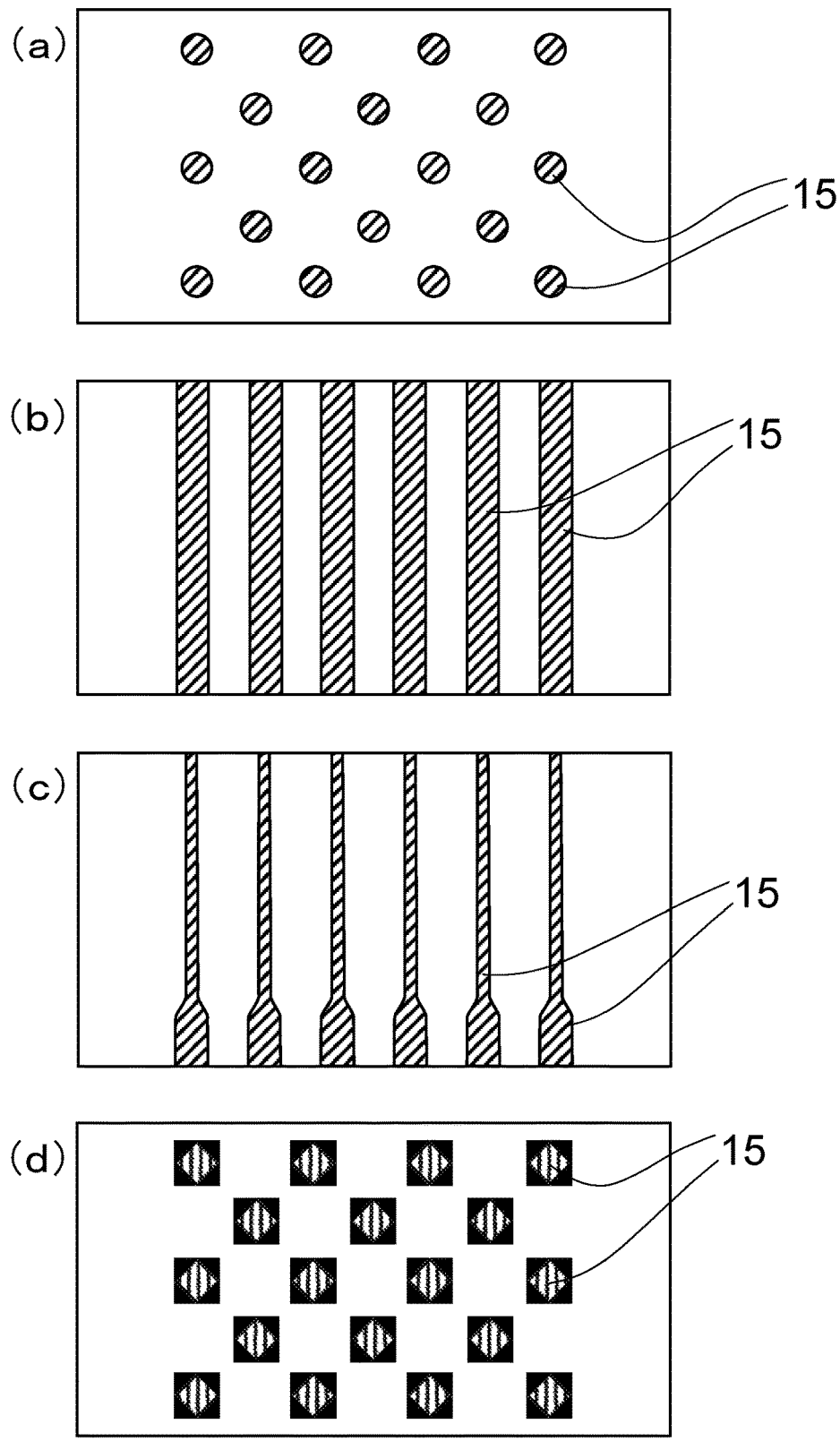
FIGS. 4(a), 4(b), 4(c), and 4(d) are a plan views of the shape in plan view of top surfaces of projections.

FIG. 4(a) is a plan view of a rear member with projections having top surfaces of which the shape in plan view is a circle. FIG. 4(b) is a plan view of a rear member with projections having top surfaces of which the shape in plan view is a rectangle. FIG. 4(c) is a plan view of a rear member with projections having top surfaces of which the shape in plan view is a broom-like shape. FIG. 4(d) is a plan view of a rear member with projections having top surfaces of which the shape in plan view is a square. In the rear members shown in FIGS. 4(a) and 4(d), circular projections and square projections are arranged to form a rhombic lattice, respectively.

It is preferable that a total area of the top surfaces of the projections 15 be 80 area % or less of an area of the opening portion 12. The excessively large total area makes a contact area between the top surfaces of the projections 15 and the planar workpiece large excessively. This makes it difficult to produce an advantageous effect due to the projections 15 formed. The total area is preferably 70 area % or less of the area of the opening portion 12, and more preferably 60 area % or less thereof.

The lower limit of the total area is not particularly limited. However, if the total area is excessively small, then the contact area between the top surfaces of the projections 15 and the planar workpiece is excessively small. This causes the planar workpiece to be supported with not a plane but points. Consequently, the planar workpiece is sometimes deformed (curved, or the like) locally at a part that is not supported with the top surfaces of the projections 15. The total area is thus preferably 10 area % or more of the area of the opening portion 12, more preferably 20 area % or more thereof, and further more preferably 30 area % or more thereof.

The projections 15 may be arranged at random on the surface of the rear member 11 facing the front member, or, alternatively, may be arranged to form a lattice. It is preferable that the projections 15 be arranged to form a lattice. The arrangement of the projections 15 in the form of a lattice causes the projections 15 to be distributed uniformly. Therefore, the treatment solution easily and uniformly flows downward when the holding jig 1 is stood in the direction of gravity. This allows the treatment solution to be discharged easily, leading to improved cleaning capabilities. Further, drainage of the treatment solution is expedited, which reduces a drag-out volume of the treatment solution. Further, the projections 15 are distributed uniformly, which makes it easy for the planar workpiece to be detached from the rear member 11.

It is preferable that the lattice form be, for example, a rectangular lattice form, a rhombic lattice form, a triangular lattice form, or a parallelogrammic lattice form. In terms of the ease with which the treatment solution is discharged and improvement in cleaning capabilities, the lattice form is more preferably, for example, a rhombic lattice form, a triangular lattice form, or a parallelogrammic lattice form.

The height of the projections 15 in a cross section of the thickness direction of the rear member 11 is not particularly limited. It is, however, preferable that the average height thereof be 1 to 3 mm. Setting the average height of the projections to fall within the range of 1 to 3 mm allows the treatment solution to easily flow in the direction of gravity. The treatment solution is thus discharged easily, leading to improved cleaning capabilities. Further, drainage of the treatment solution is expedited, which reduces a drag-out volume of the treatment solution.

It is preferable that the rear member 11 have a through-hole passing through the rear member 11 in the thickness direction. The through-hole allows the treatment solution present between the rear member 11 and the planar workpiece to be easily discharged to the rear side of the rear member 11 via the through-hole. As a result, the cleaning capabilities are improved. Further, drainage of the treatment solution is expedited, leading to reduction in a drag-out volume of the treatment solution.

The position at which to form the through-hole in the rear member 11 is not particularly limited, provided that the position is within a region except the projections. The position at which to form the through-hole may be a central part or periphery of the rear member 11 as the rear member 11 is viewed from the top.

As shown in FIG. 2, it is preferable that the through-hole be formed in an upper part 16a that is above the highest projections 15a in the direction of gravity, and/or formed in a lower part 16b that is below the lowest projections 15b in the direction of gravity. Forming the through-hole in a region of the upper part 16a and/or a region of the lower part 16b enables the treatment solution to be discharged easily and improves the cleaning capabilities. Further, drainage of the treatment solution is expedited, leading to reduction in a drag-out volume of the treatment solution. More preferably, the through-hole is formed at least in the lower part 16b that is below the lowest projections 15b in the direction of gravity.

<Other>

The type of the open/close locks 14a and 14b is not particularly limited as long as the open/close locks 14a and 14b are so structured as to avoid opening of the rear member 11 and the front member 13 in the process of liquid bath treatment. The open/close locks 14a and 14b are structured, for example, to have a concave and a convex to fit each other or to use a magnetic force.

It is preferable that a guide 21 be provided in a lower part of the holding jig 1. The guide 21 is put into a guide support provided inside the treatment tank where a liquid bath treatment is applied. The holding jig 1 is thereby fixed to the treatment tank.

The type of the liquid bath treatment is not particularly limited. Examples of the liquid bath treatment include electroplating, electroless plating, and surface treatment through immersion.

EXAMPLES

The present invention is hereinafter described in more detail in the following by way of Examples, however, the present invention is not limited to the following Examples, and modifications which do not depart from the spirit and scope of the present invention are allowed and embraced within the technical scope of the present invention.

A holding jig in which a planar workpiece is disposed between a rear member and a front member that faces the rear member and has an opening portion was used to perform a liquid bath treatment. After that, the holding jig including the planar workpiece was cleaned and the cleaning capabilities were evaluated. Further, the amount of treatment solution dragged out of a treatment tank (drag-out volume) was measured. Further, the ease with which the planar workpiece is detached after cleaning was evaluated.

As the holding jig, the holding jig shown in FIGS. 1 and 2 was used. In Nos. 2 to 5 of Table 1 provided below, as the rear member 11, a rear member having a plurality of projections 15 on the surface thereof facing the front member 13 was used. To be specific, in No. 2, as the projections 15, projections having top surfaces of which the shape in plan view is a circular shape were provided, as shown in FIG. 4(a). In No. 3, as the projections 15, projections having top surfaces of which the shape in plan view is a square shape were provided, as shown in FIG. 4(d). In No. 4, as the projections 15, projections having top surfaces of which the shape in plan view is a broom-like shape were provided, as shown in FIG. 4(c). In No. 5, as the projections 15, projections having top surfaces of which the shape in plan view is a rectangular shape were provided, as shown in FIG. 4(b). For the projections having a circular shape of No. 2, the average height of the projections in a cross section of the thickness direction of the rear member was 3 mm. For the projections having a square shape of No. 3, the average height of the projections in a cross section of the thickness direction of the rear member was 1 mm. For the projections having a broom-like shape of No. 4, the average height of the projections in a cross section of the thickness direction of the rear member was 3 mm. For the projections having a rectangular shape of No. 5, the average height of the projections in a cross section of the thickness direction of the rear member was 1 mm.

The total area of the top surfaces of the projections in No. 2 was 10 area % of the area of the opening portion. The total area of the top surfaces of the projections in No. 3 was 40 area % of the area of the opening portion. The total area of the top surfaces of the projections in No. 4 was 20 area % of the area of the opening portion. The total area of the top surfaces of the projections in No. 5 was 15 area % of the area of the opening portion. On the other hand, an example of No. 1 is a comparative example in which the holding jig having the rear member 11 with no projections 15 was used. To be specific, the total area of the top surfaces of projections in No. 1 was 0 area % of the area of the opening portion.

The holding jig has a through-hole formed in an upper part that is above the highest projections in the direction of gravity, and has a through-hole formed in a lower part that is below the lowest projections in the direction of gravity. The total area of the opening portion of the through-holes was 75 cm$^2$.

The planar workpiece was disposed in the holding jig, and the resultant was immersed, for five minutes, in a plating solution of a container having a capacity of 200 L and was subjected to a liquid bath treatment. As the plating solution, a liquid containing Sn was used. After the liquid bath treatment, the holding jig was held above the container for ten seconds to let the plating solution present on the holding jig drop naturally. After being held for ten seconds, the holding jig was immersed in a 10% GTC-1A solution (acid solution) of approximately 18 L for one minute and cleaned. The following steps were set as one cycle: immersing the holding jig in the plating solution for five minutes; holding the holding jig above the container having a capacity of 200 L for ten seconds; and immersing the holding jig in the 10% GTC-1A solution for one minute. This cycle was repeated 15 times. After that, the 10% GTC-1A solution of approximately 18 L was then diluted with water to a volume of 20 L, and the resultant was stirred for 15 minutes. After that, a Sn concentration of the solution was analyzed to calculate an amount of the plating solution mixed in the 10% GTC-1A solution. The result of calculation is shown in Table 1. The cleaning capabilities were evaluated on the basis of the amount of plating solution mixed in the 10% GTC-1A solution. To be specific, the evaluation shows that, as the amount of plating solution mixed in the 10% GTC-1A solution is large, the plating solution present on the holding jig was discharged into the 10% GTC-1A solution. This therefore means that the cleaning capabilities are good.

In applying the liquid bath treatment to the planar workpiece, an amount of the plating solution present on the holding jig and dragged out of the treatment tank (drag-out volume) was measured in the following steps.

The planar workpiece was disposed in the holding jig, and the resultant was immersed, for five minutes, in a plating solution of a container having a capacity of 200 L and was subjected to a liquid bath treatment. After the liquid bath treatment, the holding jig was held above the container for ten seconds to let the plating solution present on the holding jig drop naturally. After being held for ten seconds, the holding jig was further held, for ten minutes, above a container having a capacity of 5 L to let the plating solution present on the holding jig drop naturally. The following steps were set as one cycle: immersing the holding jig in the plating solution for five minutes; holding the holding jig above the container having a capacity of 200 L for ten seconds; and holding the holding jig above the container having a capacity of 5 L for ten minutes. This cycle was repeated 15 times. After that, an amount of liquid accumulated in the container having a capacity of 5 L was measured. The total drag-out volume of plating solution after 15 cycles is shown in Table 1. Further, a drag-out volume of plating solution per 1 dm$^2$ of the surface area of the planar workpiece was calculated and also shown in Table 1.

Table 1 below leads to the following observations. In Nos. 2 to 5, since the plurality of projections are formed on the surface of the rear member facing the front member, the plating solution present on the holding jig was discharged quickly and the cleaning capabilities were good. On the other hand, in No. 1, since a plurality of projections are not formed on the surface of the rear member facing the front member, it was difficult for a plating solution present on the holding jig to be discharged quickly and the cleaning capabilities were poor. Further, in Nos. 2, 3, and 5, as compared to the comparative example of No. 1, a drag-out volume of plating solution per unit was reduced.

TABLE 1

| No. | Shape of the projections | Fig. | The total drag-out volume of plating solution (mL) | A drag-out volume of plating solution per unit (mL/dm$^2$) | Cleaning capabilities An amount of the plating solution (mL) |
|---|---|---|---|---|---|
| 1 | No projections | — | 270 | 0.53 | 129 |
| 2 | Circular shape | (a) | 248 | 0.48 | 173 |
| 3 | Square shape | (d) | 242 | 0.47 | 173 |
| 4 | Broom-like shape | (c) | 270 | 0.53 | 153 |
| 5 | Rectangular shape | (b) | 265 | 0.52 | 153 |

Next, after the evaluation of cleaning capabilities, the planar workpiece was detached from the holding jig. At this time, the ease with which the planar workpiece is detached was evaluated. As a result, the planar workpiece was detached from the holding jig more easily in Nos. 2 to 5 than in No. 1.

DESCRIPTION OF REFERENCE SIGNS

1: Holding jig
11: Rear member
12: Opening portion
13: Front member
14a, 14b: Open/close locks
15: Projection
16a, 16b: Through-hole
21: Guide
31: Contacts
32: Shielding members

The invention claimed is:
1. A holding jig for holding a planar workpiece and immersing the planar workpiece in a liquid bath in a plating solution of a container, the holding jig comprising:
   a rear member; and
   a front member that faces the rear member and has an opening portion, wherein the rear and front members are arranged so that the planar workpiece is disposed between the rear member and the front member, the planar workpiece has a first surface facing the front member and a second surface facing the rear member, the opening portion of the front member faces the first surface of the planar workpiece, the rear member, the front member, and the planar workpiece are to be immersed in the plating solution, and the first surface of the planar workpiece is partially exposed through the opening portion, wherein the rear member has a plurality of projections formed on a surface of the rear member facing the front member, and top surfaces of the plurality of projections contact the second surface of the planar workpiece;

wherein the projections have an average height of 1 to 3 mm in a cross section of a thickness direction of the rear member;

wherein a total area of the top surfaces of the projections is between 10% to 40% of an area of the opening portion.

2. The holding jig according to claim 1,
wherein a shape of top surfaces of the projections in plan view has a linear portion that is not parallel to a direction orthogonal to a direction of gravity.

3. The holding jig according to claim 2,
wherein the shape of the top surfaces of the projections in plan view is a polygon.

4. The holding jig according to claim 3,
wherein the polygon is a rhombus.

5. The holding jig according to claim 1,
wherein the projections are arranged to form a lattice in the surface of the rear member facing the front member.

6. The holding jig according to claim 5,
wherein the lattice is a rhombic lattice, or a triangular lattice.

7. The holding jig according to claim 1,
wherein the rear member has a through-hole passing through the rear member in the thickness direction.

8. The holding jig according to claim 7,
wherein the through-hole is formed in an upper part that is above highest projections in the direction of gravity, and/or formed in a lower part that is below lowest projections in the direction of gravity.

* * * * *